(12) United States Patent
Kitada et al.

(10) Patent No.: US 6,404,032 B1
(45) Date of Patent: Jun. 11, 2002

(54) SEMICONDUCTOR DEVICE

(75) Inventors: Mizue Kitada; Shinji Kunori, both of Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 09/820,837

(22) Filed: Mar. 30, 2001

(30) Foreign Application Priority Data

Mar. 31, 2000 (JP) ........................................ 2000-097554

(51) Int. Cl.[7] ...................... H01L 29/47; H01L 29/812; H01L 29/861
(52) U.S. Cl. ........................................ 257/471; 257/481
(58) Field of Search .................................. 257/471, 481

(56) References Cited

U.S. PATENT DOCUMENTS

| | | | |
|---|---|---|---|
| 5,148,241 A | * | 9/1992 | Sugita |
| 5,216,275 A | | 6/1993 | Chen ........................... 257/493 |
| 5,241,195 A | | 8/1993 | Tu et al. ...................... 257/155 |
| 5,430,323 A | | 7/1995 | Yamazaki et al. ........... 257/471 |
| 5,438,215 A | | 8/1995 | Tihanyi ........................ 257/401 |
| 6,252,288 B1 | * | 2/2001 | Chang |

FOREIGN PATENT DOCUMENTS

| | | |
|---|---|---|
| EP | 0 372 428 | 6/1990 |
| JP | 2-154464 | 6/1990 |
| JP | 6-163878 | 6/1994 |
| JP | 8-204210 | 8/1996 |
| WO | WO 00/74130 A1 | 12/2000 |

* cited by examiner

*Primary Examiner*—Stephen D. Meier
(74) *Attorney, Agent, or Firm*—Armstrong, Westerman & Hattori, LLP.

(57) ABSTRACT

Trenches are formed in the surface of a second semiconductor layer of a first conductivity type. A semiconductor filled material of a second conductivity type is filled in the trench. A Schottky metal electrode is formed on the surface of the second semiconductor layer and the surface of the semiconductor filled material. A Schottky junction is formed between the Schottky metal electrode and the second semiconductor layer. An ohmic contact is formed between the Schottky metal electrode and the semiconductor filled material. An avalanche breakdown voltage is increased when the impurity concentration of the second semiconductor layer and the semiconductor filled material and the interval between the trenches are set such that both the second semiconductor layer interposed between the semiconductor filled materials and the semiconductor filled material are completely depleted when the Schottky junction is reverse biased.

4 Claims, 8 Drawing Sheets

SEMICONDUCTOR DEVICE

BACKGROUND OF THE INVENTION

1. Field of the Invention

The present invention relates to a semiconductor device, in particular, to a semiconductor device having a Schottky barrier diode structure.

2. Description of Related Art

While a Schottky barrier diode (SBD) has a low forward voltage and a high switching speed, the SBD has high reverse leakage current and a low reverse avalanche breakdown voltage as its disadvantage. In a medium or high voltage product of 100 V or higher, in particular, the reverse leakage current needs to be reduced to prevent thermorunaway. The impurity concentration of a drift region needs to be lowered so that a depletion layer is expanded while maintaining a high Schottky barrier height. As a result, forward characteristics are deteriorated.

Figure 10:
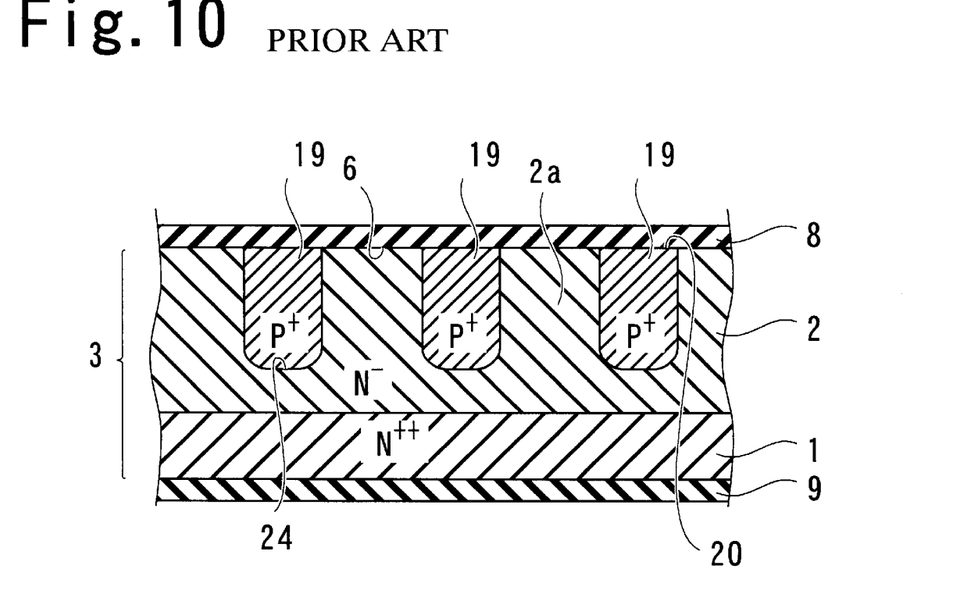
FIG. 10 is a schematic cross section of a conventional device.

FIG. 10 shows a structure for reducing leakage current by utilizing a pinch-off effect due to a junction used in a low voltage product. In this figure, an n-type semiconductor layer 2 (hereinafter, referred to as N⁻ epi-layer 2) having a low impurity concentration is formed on an n-type semiconductor substrate 1 (hereinafter, referred to as n-type substrate 1) having a high impurity concentration by epitaxial growth. P-type semiconductor regions 19 (hereinafter, referred to as P⁺ regions 19) having a high impurity concentration are disposed at prescribed intervals in the main surface of the N⁻ epi-layer 2 by diffusion or embedding of polycrystalline silicon in the trench. An anode electrode film 8 contacted to the main surface 6 of the N⁻ epi-layer 2 and surfaces 20 of the P⁺ regions 19 is formed. The anode electrode film 8 has Schottky contact with the main surface 6 of the N–epi-layer 2. A cathode electrode film 9 having ohmic contact with the n-type substrate 1 is formed on the other surface of the n-type substrate 1.

Figure 11:
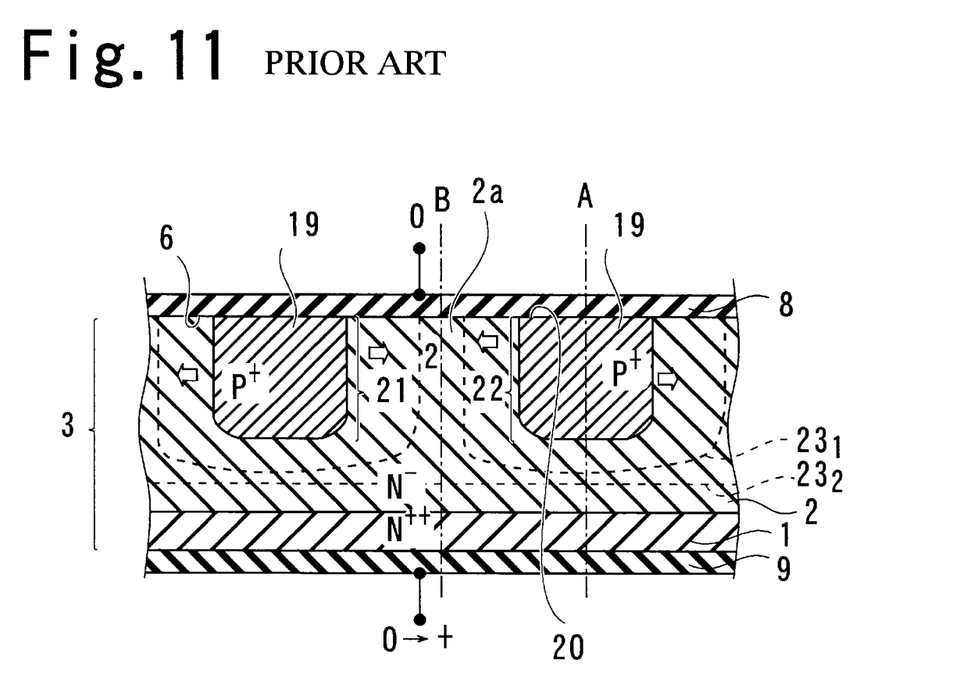
FIG. 11 is an explanatory view of the conventional device in operation.

When a reverse voltage is gradually applied to an SBD in FIG. 10, depletion layers $23_1$ extend from side surfaces 21, 22 of the P⁺ regions 19 into a region 2a in the N⁻ epi-layer 2 interposed between the adjacent P⁺ regions 19 as shown in FIG. 11. When the reverse voltage is further applied, edges of the depletion layers extending from the side surfaces 21, 22 of the P⁺ regions 19 come into contact with each other (pinch-off) and become one wide depletion layer $23_2$. Therefore, an electric field applied to an interface between the main surface 6 of the N⁻ epi-layer 2 and the anode electrode film 8 is relaxed and thereby reverse leakage current can be reduced.

Figure 12:
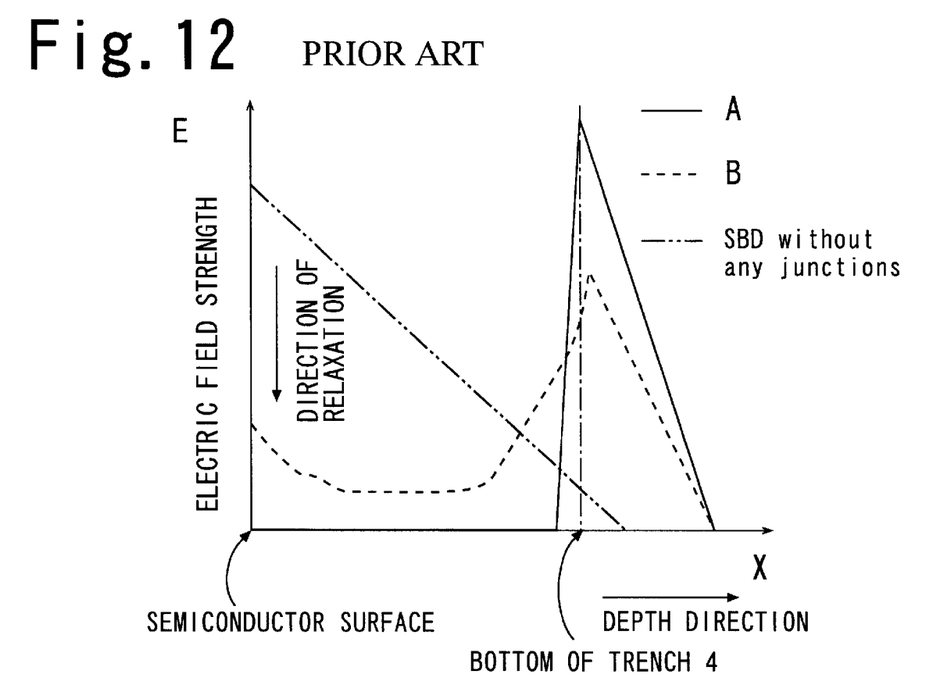
FIG. 12 is a graph showing characteristics of the electric field strength distribution of the conventional device.

FIG. 12 shows a distribution of electric field strengths in a vertical direction along lines A and B, which are located at the centers of the P⁺ region 19 and the N⁻ epi-region 2a interposed between the P⁺ regions 19, respectively, when a reverse avalanche breakdown voltage is applied to the semiconductor device in a pinch-off state in FIG. 10. As described above, it is evident from FIG. 12 that an electric field applied to the interface between the main surface 6 of the N⁻ epi-layer 2 and the anode electrode film 8 is relaxed.

However, if the structure shown in FIG. 10 is applied to a medium or high voltage product of 100 V or higher, an electric field is increased at a pn junction between the bottom 24 of the P⁺ region 19 and the N⁻ epi-layer 2, leading to deterioration of the reverse avalanche breakdown voltage. To maintain the reverse avalanche breakdown voltage, the impurity concentration of the N⁻ epi-layer 2 needs to be lowered, resulting in deterioration of forward characteristics.

Figure 13:
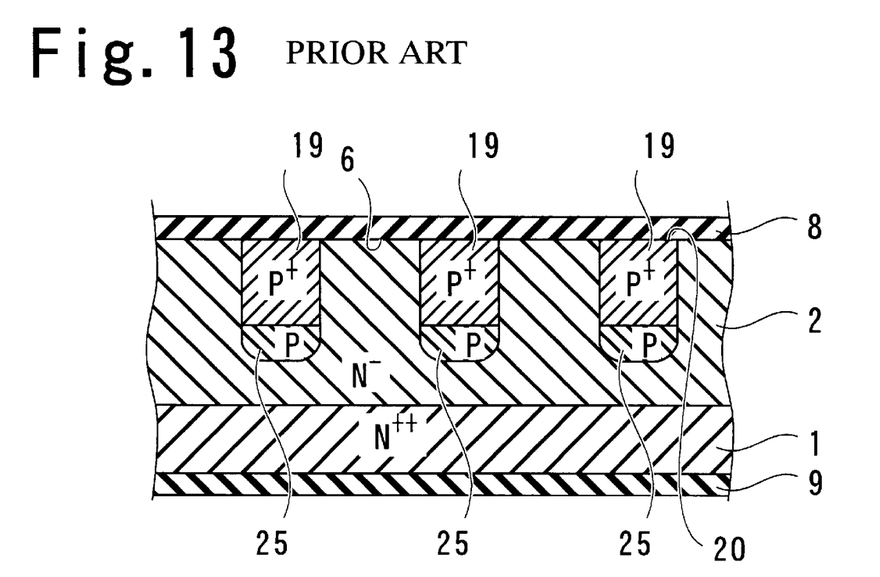
FIG. 13 is a schematic cross section of the conventional device.

There is also a structure in which only a bottom portion of the P⁺ region 19 in FIG. 10 is formed of a p-type-semiconductor region 25 having a low impurity concentration to relax the electric field at the bottom of the P⁺ region 19 as shown in FIG. 13. However, if the impurity concentration of the p-type semiconductor region 25 becomes lower than a desired concentration, an electric field is concentrated at the bottom of the P⁺ region 19, resulting in deterioration of the reverse avalanche breakdown voltage. If the impurity concentration of the p-type semiconductor region 25 is higher than a desired concentration, an electric field is concentrated at the bottom of the p-type semiconductor region 25, also resulting in deterioration of the reverse avalanche breakdown voltage.

In this structure, a large region having a low impurity concentration needs to be provided at the bottom to sufficiently relax the electric field. However, if a region having a low impurity concentration is further extended to under the p-type semiconductor region 25, a thickness of the N⁻0 epi-layer 2 needs to be increased, resulting in deterioration of forward characteristics, which is a trade-off.

When reverse leakage current is reduced and a reverse avalanche breakdown voltage is maintained in a Schottky barrier diode with a medium or high avalanche breakdown voltage of 100 V or higher to prevent thermorunaway, there exists a trade-off that forward characteristics are deteriorated since the impurity concentration of the N⁻ epi-layer is lowered or a pinch-off effect due to the junction is utilized.

SUMMARY OF THE INVENTION

In view of the foregoing, an object of the present invention is to provide a semiconductor device such as a Schottky barrier diode or the like in which reverse leakage current is maintained at a conventional level while forward characteristics are greatly improved.

To achieve the above object, the present invention provides a semiconductor device having a first semiconductor layer composed of a semiconductor of a first conductivity type, a second semiconductor layer of the first conductivity type having a lower impurity concentration than that of the first semiconductor layer, trench portions composed of thin trenches having a prescribed width and prescribed intervals therebetween formed in the second semiconductor layer surface, a semiconductor filled material composed of semiconductor of a second conductivity type, which is opposite to the first conductivity type, filled in the trench portions, a Schottky metal electrode formed, on the surface of the second semiconductor layer and the surface of the semiconductor filled material while forming a Schottky junction with the second semiconductor layer and an ohmic contact with the semiconductor filled material, and an ohmic metal electrode formed on the surface of the first semiconductor layer. In this semiconductor device, at least the second semiconductor layer and the semiconductor filled material are constituted by the same semiconductor material. When an avalanche breakdown voltage $BV_{AK}$ between the semiconductor filled material and the second semiconductor layer is expressed by $$BV_{AK} = 60 \times (E_g/1.1)^{1.5} \times (N_d/10^{16})^{-3/4}$$

(where the unit of $BV_{AK}$ is V; $N_d$ represents an impurity concentration of the second semiconductor layer and its unit is cm⁻³; and $E_g$ represents an energy band gap value of the semiconductor material and its unit is eV), the width $W_m$ between the semiconductor filled materials adjacent to each other formed in the second semiconductor layers satisfies the following equations (1) and (2):
(where the unit of the width $W_m$ is cm; $W_t$ represents a width $$W_m \simeq \frac{W_t \times N_d}{N_a} \quad (1)$$

of the semiconductor filled material and its unit is cm; and $N_a$ represents an impurity concentration in the semiconductor filled material and its unit is cm$^{-3}$)

$$W_m \leq \sqrt{\frac{2 \times \varepsilon_0 \times \varepsilon_S \times (BV_{AK}/n)}{q \times N_d}} \quad (2)$$

(where $\varepsilon_s$ represents a relative permittivity of the semiconductor material; $\varepsilon_0$ represents a permittivity in vacuum and is 8.85418×10$^{-14}$ F/cm; and q represents an elementary electrical charge and is 1.60218×10$^{-19}$ coulomb; and in equation (2), n>1).

The present invention also provides a semiconductor device in which an insulating film is formed on the sidewall and the bottom surface of the trench portion and the insulating film is disposed between the semiconductor filled material and the second semiconductor layer.

The present invention also provides a semiconductor device in which a high impurity concentration layer of the second conductivity type is formed on the surface of the semiconductor filled material.

BRIEF DESCRIPTION OF THE DRAWINGS

FIGS. 8(a) to 8(d) are cross sections showing processes of fabricating a device according to one embodiment of the invention;

DETAILED DESCRIPTION OF THE PREFERRED EMBODIMENTS

Figure 1:
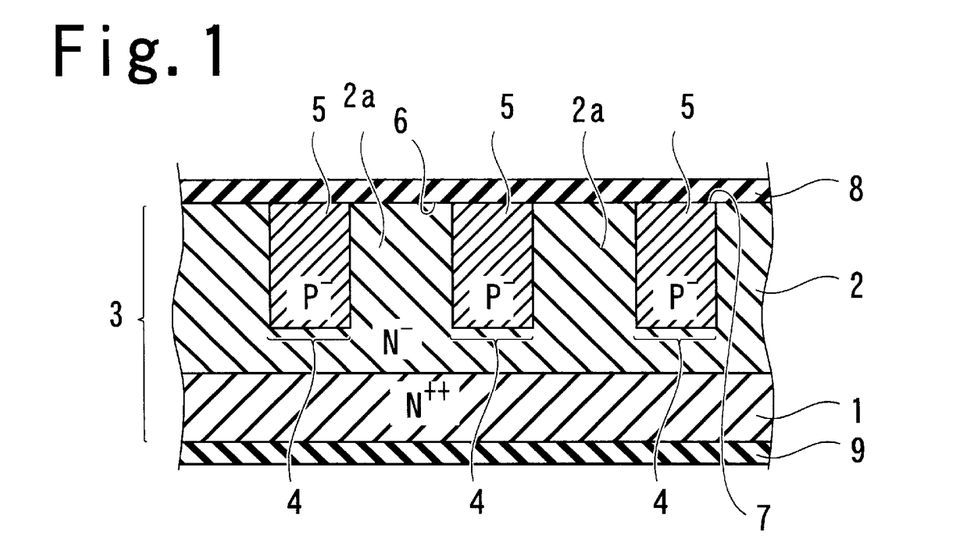
FIG. 1 is a schematic cross section showing one embodiment of the invention.

FIG. 1 is a schematic cross section showing one embodiment of the present invention. This semiconductor device has a structure provided with a semiconductor substrate 3, a semiconductor filled material ($^-$ P region) 5, a first electrode film (anode electrode film) 8, and a second electrode film (cathode electrode film) 9. The semiconductor substrate 3 is constituted by laminating a first semiconductor layer (n-type substrate) 1 of a first conductivity type and a second semiconductor layer (N$^-$ epi-layer) 2 of the first conductivity type having a lower impurity concentration than that of the first layer. The semiconductor filled material (P$^-$ region) 5 is obtained by filling polycrystalline silicon of a second conductivity type up to the same level as the surface of the N$^-$ epi-layer 2 in trenches 4 having a prescribed width formed at prescribed intervals in a surface of the N$^-$ epi-layer 2 on one main surface side of this semiconductor substrate 3. The first electrode film (anode electrode film) 8 is composed of a metal which is brought into contact with both the surface 6 of the N$^-$ epi-layer 2 and the surface 7 of the semiconductor filled material 5 and has Schottky junction with the surface 6 of the N$^-$ epi-layer 2. The second electrode film (cathode electrode film) 9 forms ohmic contact with the n-type substrate 1 on the other main surface of the semiconductor substrate 3. In this semiconductor device, the impurity concentration of the semiconductor filled material 5 is so low that the whole semiconductor filled material 5 is depleted when a reverse voltage is applied to the pn junction between the N$^-$ epi-layer 2 and the semiconductor filled material 5.

Figure 2:
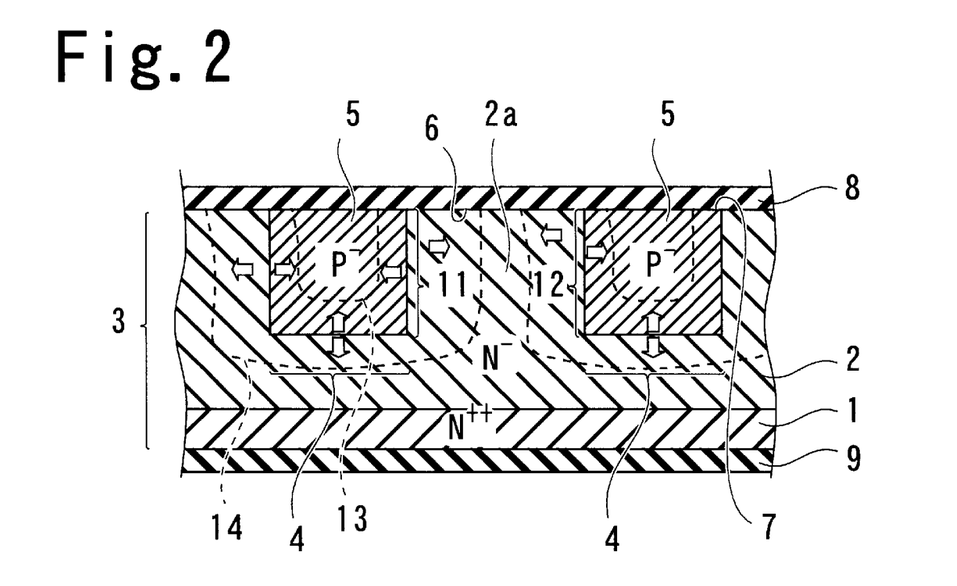
FIG. 2 is an explanatory view of the embodiment of the invention in operation.
Figure 3:
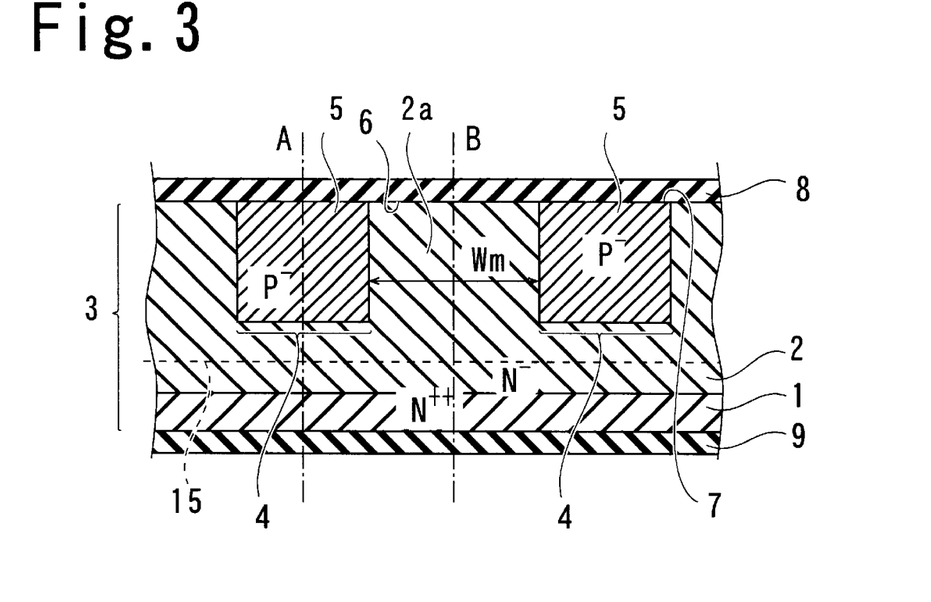
FIG. 3 is an explanatory view of the embodiment of the invention in operation.

This embodiment will be described below with reference to FIGS. 2 and 3. FIGS. 2 and 3 are explanatory views of this embodiment of the invention in operation. First, when a reverse voltage starts to be applied to the semiconductor device, depletion layers 13, 14 extend from opposed sidewalls 11, 12 of adjacent trenches 4 to the N$^-$ epi-region 2a interposed between the trenches 4 and the semiconductor filled material 5 in a lateral direction as shown in FIG. 2. When the reverse voltage is further applied, the width $W_m$ between the adjacent trenches 4 formed in the surface of the N$^-$ epi-layer 2 is preferably a width $W_m$ which allows the depletion layers extending from the opposed sidewalls 11, 12 of the adjacent trenches 4 to be connected with each other.

The width $W_m$ which allows the depletion layers extending from the adjacent trenches 4 to be connected with each other means a width $W_m$ which also allows the whole N$^-$ epi-region 2a interposed between the trenches 4 to be depleted when the whole semiconductor filled material 5 is depleted. This width $W_m$ is related to the width $W_t$ and the concentration $N_a$ of the semiconductor filled material 5 formed in the trench 4 and the concentration $N_d$ of the N$^-$ epi-layer 2a. When an avalanche breakdown voltage $BV_{AK}$ between the semiconductor filled material and the second semiconductor layer is expressed by $$BV_{AK} = 60 \times (E_g/1.1)^{1.5} \times (N_d/10^{16})^{-3/4}$$

(where the unit of $BV_{AK}$ is V; $N_d$ represents an impurity concentration of the second semiconductor layer and its unit is cm$^{-3}$; $E_g$ represents an energy band gap value of the semiconductor material and its unit is eV; when the semiconductor material is silicon, $E_g$ is 1.12 eV, and when the material is GaAs, $E_g$ is. 1.43 eV.), the width $W_m$ of between semiconductor filled materials adjacent to each other formed in the second semiconductor layers satisfies the following equations (1) and (2):

$$W_m \simeq \frac{W_t \times N_d}{N_a} \quad (1)$$

(where the unit of the width $W_m$ is cm; $W_t$ represents a width of the semiconductor filled material and its unit is cm; and $N_a$ represents an impurity concentration in the semiconductor filled material and its unit is cm$^{-3}$)

$$W_m \leq \sqrt{\frac{2 \times \varepsilon_0 \times \varepsilon_S \times (BV_{AK}/n)}{q \times N_d}} \quad (2)$$

(where $\varepsilon_s$ represents a relative permittivity of the semiconductor material; $\varepsilon_0$ represents a permittivity in vacuum and is 8.85418×10$^{-14}$ F/cm; represents an elementary electrical charge and is 1.60218×10$^{-19}$ coulomb; and in equation (2), n>1).

When the whole semiconductor filled material 5 is depleted, the whole N$^-$ epi-region 2a is also depleted only under the condition under which these equations (1) and (2) are satisfied. That is, since both the semiconductor filled material 5 and the N$^-$ epi-region 2a are depleted, one wide depletion layer 15 connected from the anode electrode film 8 to the bottom of the trench 4 is formed as shown in FIG. 3. When a reverse voltage is further applied, the voltage applied after formation of this wide depletion layer 15 is generally applied into this wide depletion layer 15. This wide depletion layer 15 is formed by depletion layers extending from the sidewalls 11, 12 of the trenches 4 in the lateral direction. At the point when the depletion layers 13 extending from the trenches 4 in the lateral direction are connected, the electric field in the depletion layer 15 is still low. When the reverse voltage is further applied, the electric field strength in the depletion layer 15 is increased as a whole. When the electric field strength reaches the critical value, breakdown starts. In case of a reverse avalanche breakdown voltage at the pn junction, breakdown occurs in the vicinity of the pn junction portion where the electric field strength becomes the highest. In the structure of the semiconductor device of the present invention, however, breakdown does not necessarily occur in the vicinity of the pn junction portion. The electric field strength of the pn junction can be sufficiently relaxed by forming the above-described depletion layer 15. The avalanche breakdown voltage may be reached at the center between the adjacent trenches 4 in the N$^-$ epi-region 2a interposed between semiconductor filled material 5 before breakdown occurs in the vicinity of the pn junction portion.

It is preferable that the impurity concentrations $N_d$ and $N_a$, the width $W_t$, and the width $W_m$ satisfy the equation $W_m = W_t \times N_d / N_a$ but $W_m$ can not be completely equal to $W_t \times N_d / N_a$ on practically manufactured devices. The symbol connecting the left-hand and the right-hand side of the equation (1) means "approximately equal" and used here to include error arisen in manufacture which is within the range that does not affect avalanche breakdown voltage much.

As described above, a plurality of straight trenches having an approximate rectangular cross section are arranged in parallel and the equation (1) means that the total amount of the impurities disposed in a region between the adjacent trenches filled with the semiconductor material is approximately equal to the total amount of the impurities in one trench.

When the semiconductor filled material disposed in the trenches and the semiconductor material disposed in the region interposed between the trenches are reverse biased, depletion layers extend from two trenches facing to each other and being located at the both sides of the semiconductor material to the semiconductor material interposed between the trenches.

Equation (2) means that the depletion layers extending from the opposite sides of the semiconductor material come into contact in the semiconductor material disposed in the region interposed between the two trenches facing each other before the reverse bias voltage reaches the avalanche breakdown voltage of the semiconductor material and the avalanche breakdown voltage of the,semiconductor filled material.

Figure 4:
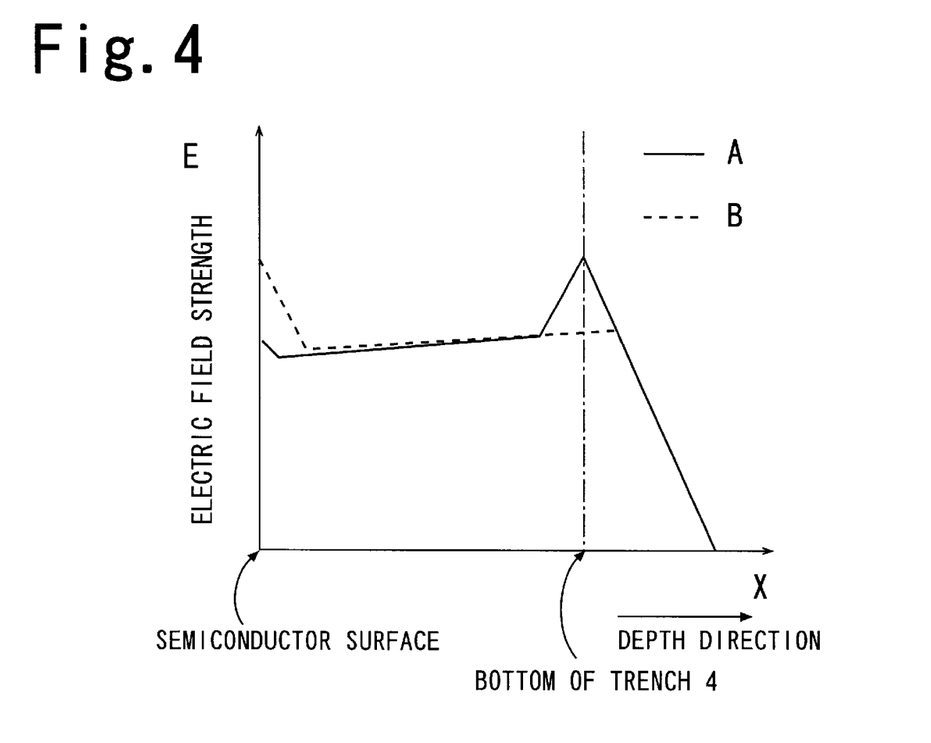
FIG. 4 is a graph showing characteristics of the electric field strength distribution in the embodiment of the invention.

FIG. 4 shows the distribution of electric field strengths in a vertical direction along lines A and B, which are located at the centers of the semiconductor filled materials 5 and the N$^-$ epi-region 2a interposed between the trenches 4, respectively, when a reverse avalanche breakdown voltage is applied to the semiconductor device in FIG. 1. As described above, the electric field strength in the depletion layer 15 is increased as a whole. The electric field strength in the depletion layer is increased with the same gradient as when the depletion layers 13 extending from the sidewalls 11, 12 of the trenches 4 are connected and depleted and becomes generally uniform in the depletion layer 15. There is no site where the electric field strength is particularly high. Therefore, when the N$^-$ epi-layer 2 has such an impurity concentration $N_d$ as to allow the depletion layers 13 extending from the sidewalls 11, 12 of the trenches 4 in the lateral direction to be connected, a reverse avalanche breakdown voltage can be increased without lowering the impurity concentration unlike a conventional structure product since the width of the depletion layer 15 can be further increased only by increasing the depth of the trench 4. Therefore, forward characteristics can be greatly improved while the electric field strength applied to the interface between the main surface 6 of the N$^-$ epi-layer 2 and the anode electrode film 8 is maintained at the same level as that of . conventional structure product.

In the structure of the present invention, the reverse avalanche breakdown voltage can be determined only by changing the width of the depletion layer 15 extending downward from the anode electrode film 8. In other words, the reverse avalanche breakdown voltage is determined depending on the depth of the trench 4 having the semiconductor filled material 5 therein. Therefore, when the width $W_m$ of the N$^-$ epi-region 2a interposed between the trenches 4 and the impurity concentration in the N$^-$ epi-layer 2 are set such that the depletion layers 13 extending from the trenches 4 in the lateral direction are connected, medium and high avalanche breakdown voltages can be obtained without lowering, the impurity concentration of the N$^-$ epi-layer 2 to increase a reverse avalanche breakdown voltage unlike a conventional structure product. That is, there is no increase in leakage current when a reverse voltage is applied and thereby forward characteristics can be greatly improved.

A method of fabricating a device of the present invention (Schottky barrier diode) will be described below with reference to FIGS. 8(a) to 8(d). FIGS. 8(a) to 8(d) are cross sections showing processes of fabricating the SBD.

Figure 8A:
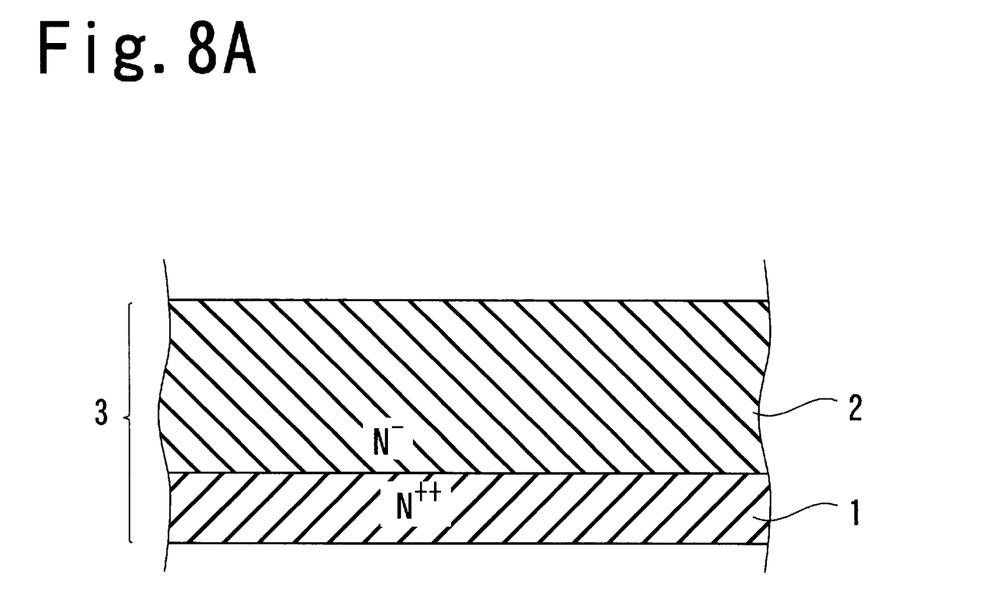

First, a semiconductor substrate 3 is formed by laminating an N$^-$ epi-layer 2 (phosphorus concentration $N_d$=1×10$^{16}$ atoms/cm$^3$) having a thickness of about 10 μm on an n-type substrate 1 (arsenic concentration 2×10$^{19}$ atoms/cm$^3$) by epitaxial growth as shown in FIG. 8(a).

Figure 8B:
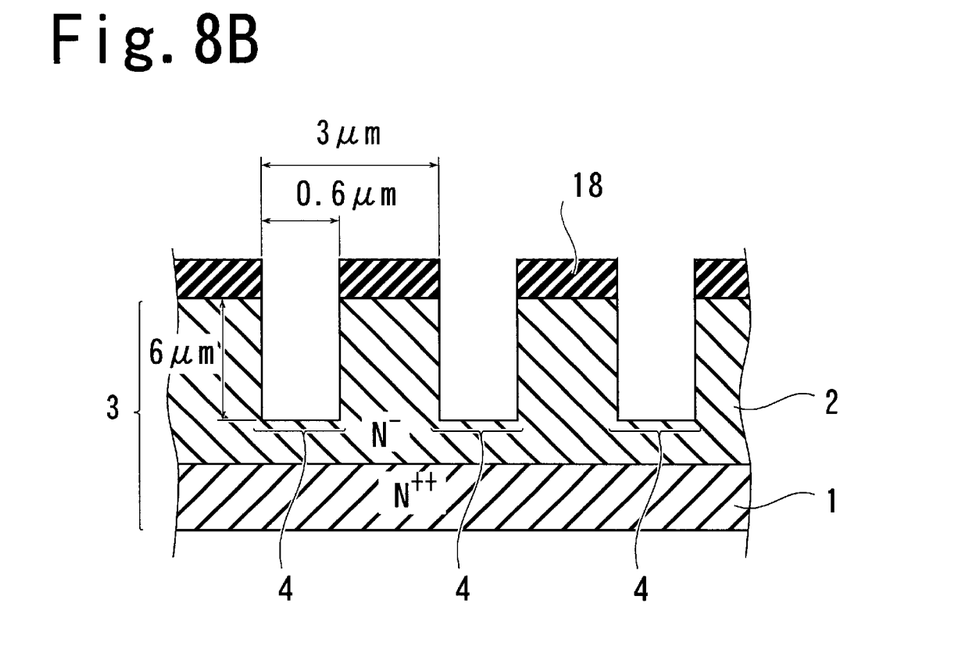

Subsequently, a silicon oxide film 18 is formed about 5000×10$^{-8}$ cm on the surface of the N$^-$ epi-layer 2 by thermal oxidation. Then, the silicon oxide film 18 is removed with a width $W_t$ of about 0.6 μm and left with a width $W_m$ of about 2.4 μm by photolithography resulting in stripes. By using this film as a mask, silicon of the N⁻ epi-layer 2 is etched with a gas to form trenches 4 of about 6 μm in depth from the surface of N⁻ epi-layer as shown in FIG. 8(b). At this time, n=1.42 in the aforementioned equation (2).

Figure 8C:
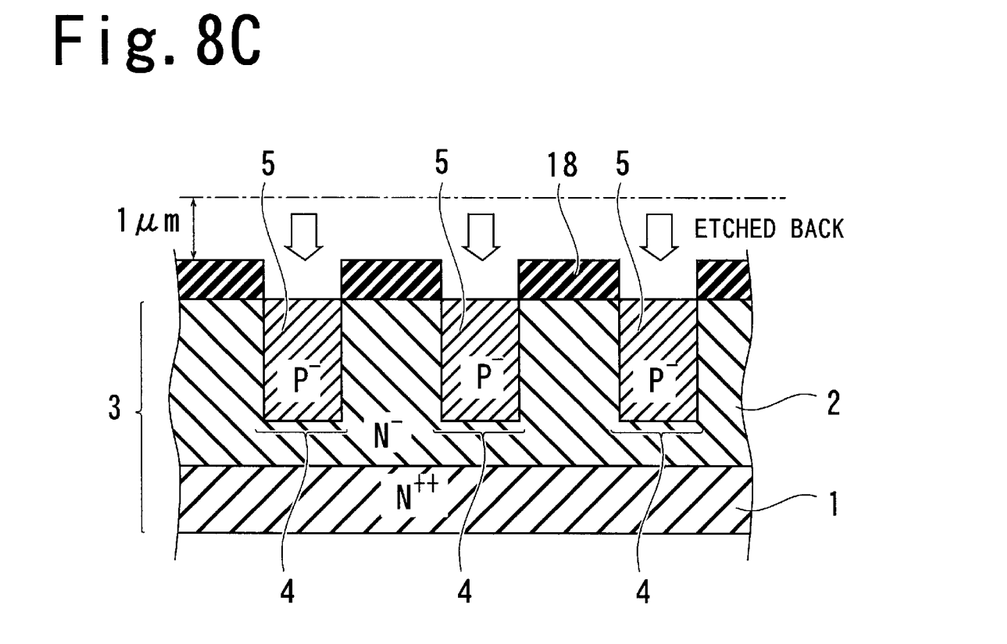

Subsequently, polycrystalline silicon into which boron of $N_a$=about $4 \times 10^{16}$ atoms/cm³ is doped is deposited about 1 μm on the inner surface of the trenches 4 and on the surface of the silicon oxide film 18 as shown in FIG. 8(c) and then etched back until its height becomes the same level as the surface of the N⁻ epi-layer 2.

Figure 8D:
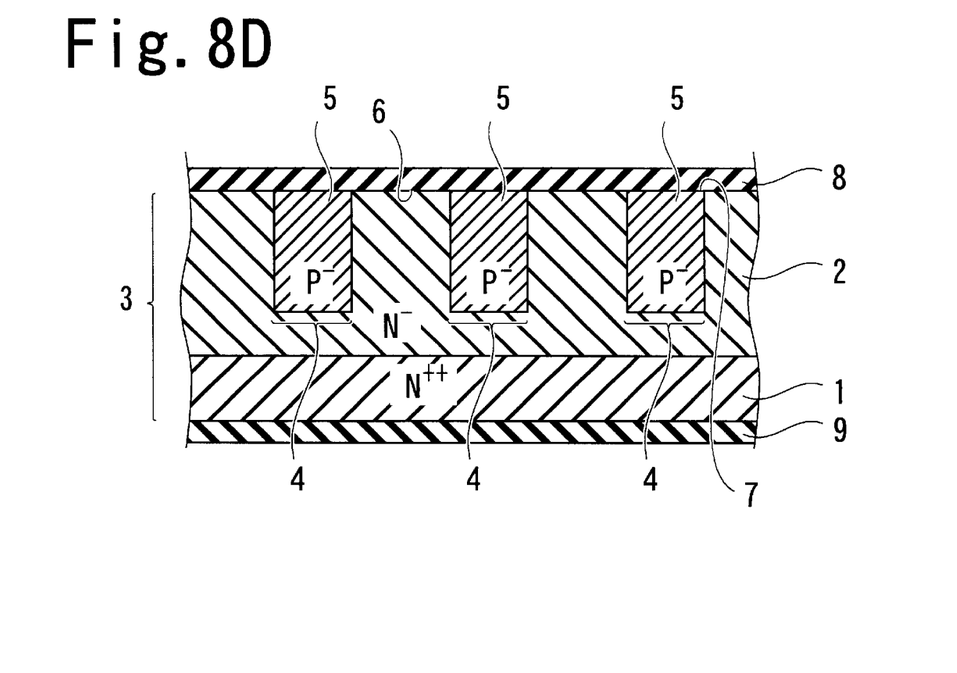
Figure 9:
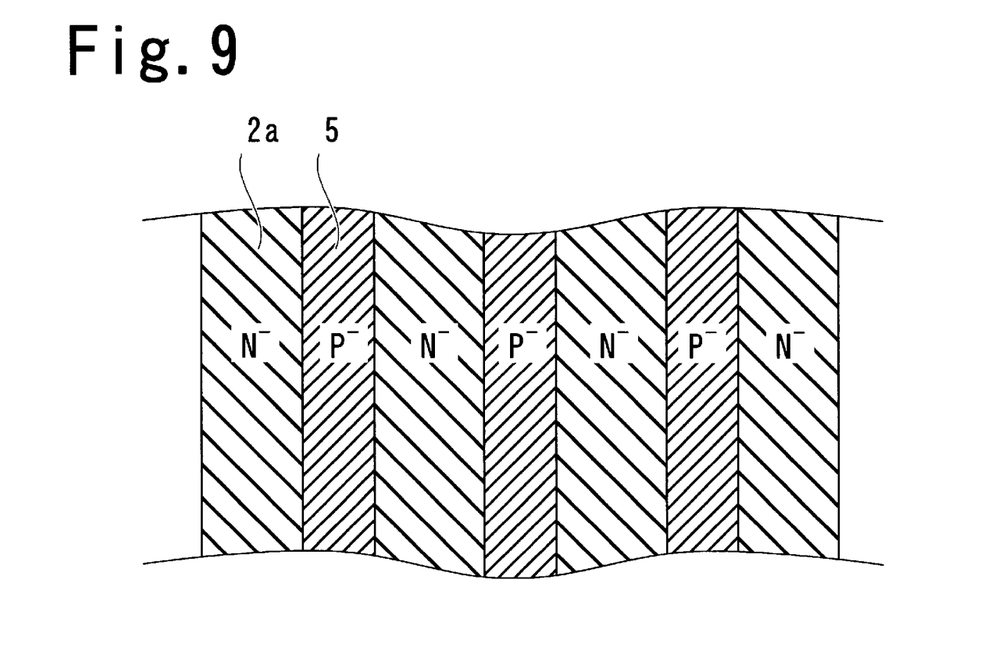
FIG. 9 is a schematic plan view of a device according to the embodiment of the invention.

Subsequently, the silicon oxide film 18 used as a mask for forming trenches 4 is removed by etching. Schottky barrier metal is vapor deposited on the surface 6 of the N⁻ epi-layer 2 and the surface 7 of the polycrystalline silicon filled in the trenches 4 to form an anode electrode film 8. A cathode electrode film 9 is formed on the other side of the n-type substrate, which is a rear surface, and thus this embodiment of the invention is accomplished as shown in FIG. 8(d) (embodiments of the peripheral structure are omitted).

Figure 5:
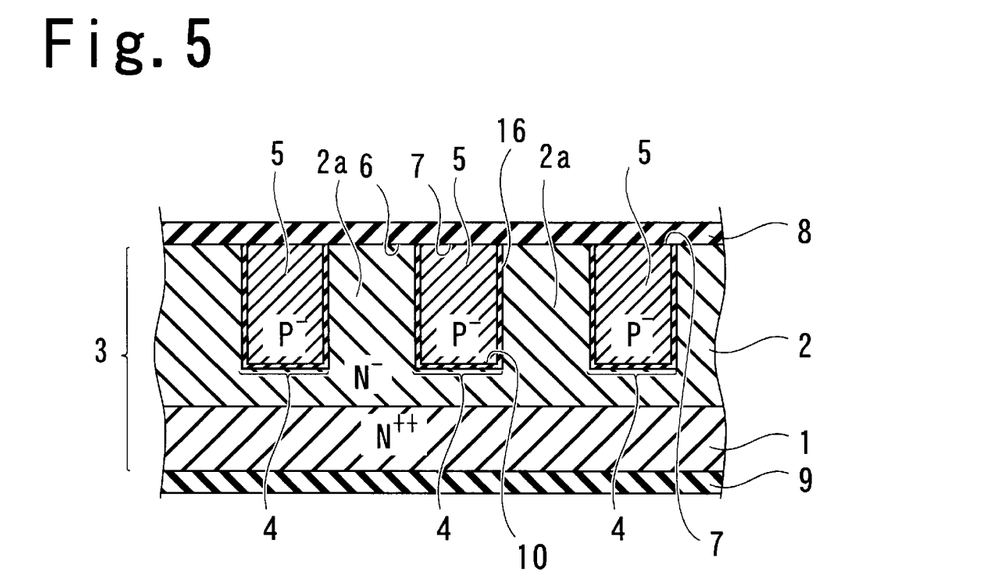
FIG. 5 is a schematic cross section showing another embodiment of the invention.
Figure 6:
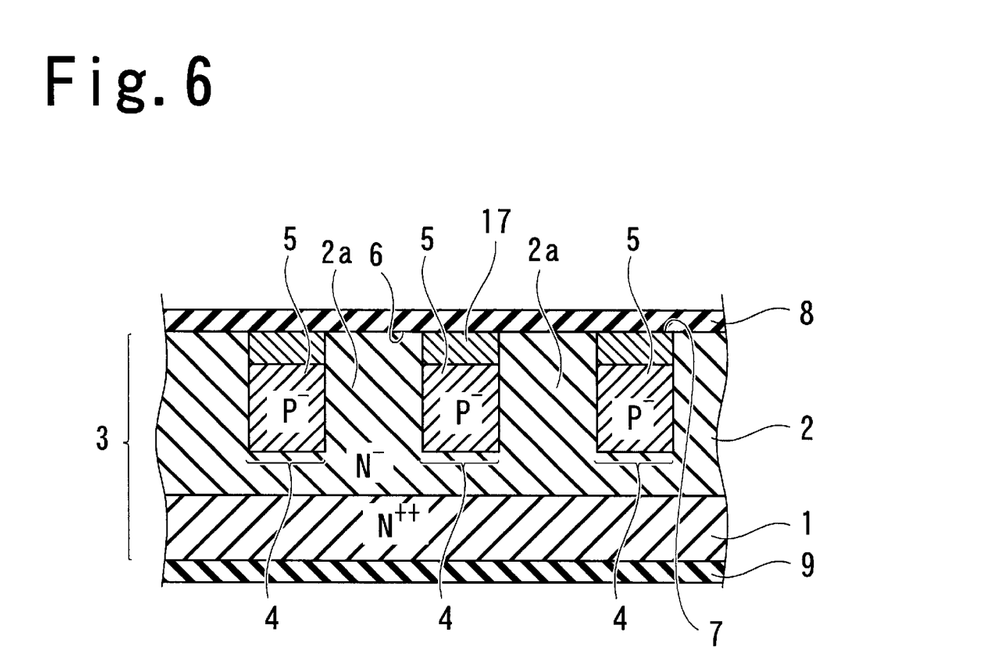
FIG. 6 is a schematic cross section showing another embodiment of the invention.
Figure 7:
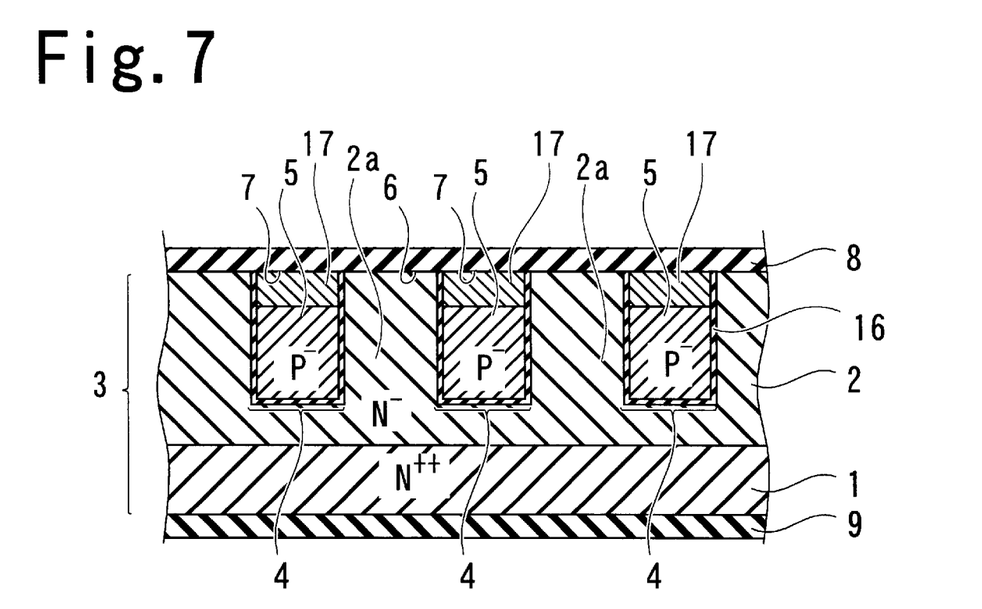
FIG. 7 is a schematic cross section showing another embodiment of the invention.

FIGS. 5, 6 and 7 show structures of other embodiments of the invention. FIG. 5 is a cross section showing an example where an insulating film 16 is formed on the sidewalls 11, 12 and the bottom surface 10 of the trenches 4 in advance when polycrystalline silicon (semiconductor filled material 5) having a low impurity concentration is filled in the trenches 4 and then a semiconductor filled material 5 is provided. This insulating film 16 plays a role of making leakage current almost 0 (zero) when a reverse voltage is applied between the polycrystalline silicon and the N⁻ epi-layer 2.

FIG. 6 shows an example where a fourth semiconductor region (P⁺⁺ region) 17 of the second conductivity type having a high impurity concentration is provided so that the depletion layer 14 extending to the semiconductor filled material 5 when a reverse voltage is applied does not reach the surface 7 of the semiconductor filled material 5. This P⁺⁺ region 17 can prevent leakage current which occurs because the depletion layer 14 formed upon application of a reverse voltage reaches the anode electrode film 8 brought into contact with the surface 7 of the semiconductor filled material 5 (punch through) and can make the potential of the semiconductor filled material 5 the same as that of the anode electrode film 8 by having ohmic contact with the anode electrode film 8 brought into contact with the surface 7 of the semiconductor filled material 5.

Furthermore, FIG. 7 shows a combination of the above-described structures, which is an example where an insulating film 16 is formed in the trenches 4 and then a P⁺⁺ region 17 is formed on the surface of the semiconductor filled material 5.

Not polycrystalline silicon, but single crystal silicon of the second conductivity type may be formed by epitaxial growth to constitute the semiconductor filled material 5.

The reverse leakage current which occurs when the semiconductor filled material 5 is constituted by polycrystalline silicon can be reduced by forming p⁻-type single crystal silicon by epitaxial growth. This structure can also be applied to all the above-described structures.

As described above, in the present invention, a p⁻ region is provided in a trench formed in a surface of an N⁻ epi-layer. Since depletion layers extending from the pn junctions of side surfaces of the trenches are connected with each other in this P⁻ region and the N⁻ epi-layer region interposed between the trenches, a wide depletion layer from the surface to the bottom of the trench can be formed to increase a reverse avalanche breakdown voltage. Therefore, the reverse avalanche breakdown voltage can be increased only by changing the depth of the trench without changing an impurity concentration of the N⁻ epi-layer. Thus, a semiconductor device such as a Schottky barrier diode or the like in which forward characteristics can be greatly improved can be provided without changing reverse characteristics.

What is claimed is:

1. A semiconductor device comprising:

a first semiconductor layer composed of a semiconductor of a first conductivity type;

a second semiconductor layer of the first conductivity type having a lower impurity concentration than that of the first semiconductor layer;

trench portions composed of thin trenches having a prescribed width and prescribed intervals therebetween formed in the surface of the second semiconductor layer;

a semiconductor filled material composed of semiconductor of a second conductivity type, which is opposite to the first conductivity type, and filled in the trench portions;

a Schottky metal electrode formed on the surface of the second semiconductor layer and the surface of the semiconductor filled material, said Schottky metal electrode forming a Schottky junction with the second semiconductor layer and an ohmic contact with the semiconductor filled material; and an ohmic metal electrode formed on the surface of the first semiconductor layer; said semiconductor device, wherein at least said second semiconductor layer and said semiconductor filled material are constituted by the same semiconductor material;

when an avalanche breakdown voltage $BV_{AK}$ between said semiconductor filled material and said second semiconductor layer is expressed by $$BV_{AK} = 60 \times (E_g/1.1)^{1.5} \times (N_d/10^{16})^{-3/4}$$

(where the unit of $BV_{AK}$ is V; $N_d$ represents an impurity concentration of the second semiconductor layer and its unit is cm⁻³; and $E_g$ represents an energy band gap value of the semiconductor material and its unit is eV), the width $W_m$ between the semiconductor filled; materials adjacent to each other formed in the second semiconductor layer satisfies the following equations (1) and (2):

$$W_m \simeq \frac{W_t \times N_d}{N_a} \quad (1)$$

(where the unit of the width $W_m$ is cm; $W_t$ represents a width of the semiconductor filled material and its unit is cm; $N_a$ represents an impurity concentration of the semiconductor filled material and its unit is cm⁻³)

$$W_m \leq \sqrt{\frac{2 \times \varepsilon_0 \times \varepsilon_S \times (BV_{AK}/n)}{q \times N_d}} \quad (2)$$

(where $\varepsilon_s$ represents a relative permittivity of the semiconductor material; $\varepsilon_0$ represents a permittivity in vacuum and is $8.85418 \times 10^{-14}$ F/cm; q represents an elementary electrical charge and is $1.60218 \times 10^{-19}$ coulomb; and in the equation (2), n>1).

2. The semiconductor device according to claim 1, wherein an insulating film is formed on sidewall and bottom surface of the trench portion and the insulating film is disposed between said semiconductor filled material and said second semiconductor layer.

3. The semiconductor device according to claim 1, wherein a high impurity concentration layer of the second conductivity type is formed on the surface of the semiconductor filled material.

4. The semiconductor device according to claim 2, wherein a high impurity concentration layer of the second conductivity type is formed on the surface of the semiconductor filled material.

* * * * *

UNITED STATES PATENT AND TRADEMARK OFFICE
CERTIFICATE OF CORRECTION

PATENT NO. : 6,404,032 B1
APPLICATION NO. : 09/820837
DATED : June 11, 2002
INVENTOR(S) : Mizue Kitada et al.

It is certified that error appears in the above-identified patent and that said Letters Patent is hereby corrected as shown below:

In column 3 on lines 4-6, change "$W_m \simeq \dfrac{W_t \times N_d}{N_a}$ (1)" to be -- $W_m \simeq \dfrac{W_t \times N_a}{N_d}$ (1) --

In column 5 on lines 4-6, change "$W_m \simeq \dfrac{W_t \times N_d}{N_a}$ (1)" to be -- $W_m \simeq \dfrac{W_t \times N_a}{N_d}$ (1) --

Also in column 5 on lines 53-54 change "$W_m = W_t \times N_d/N_a$ but $W_m$ can not be completely equal to $W_t \times N_d/N_a$" to be -- $W_m = W_t \times N_a/N_d$ but $W_m$ cannot be completely equal to $W_t \times N_a/N_d$ --

<u>In the Claims:</u>
in claim 1 column 8 on lines 50-53, change "$W_m \simeq \dfrac{W_t \times N_d}{N_a}$ (1)" to be -- $W_m \simeq \dfrac{W_t \times N_a}{N_d}$ (1) --

Signed and Sealed this

Twelfth Day of December, 2006

JON W. DUDAS
*Director of the United States Patent and Trademark Office*